US 6,634,893 B1

(12) United States Patent
Korsunsky et al.

(10) Patent No.: US 6,634,893 B1
(45) Date of Patent: Oct. 21, 2003

(54) ELECTRICAL CONNECTOR HAVING RETENTION CONTACT TAILS AND NON-RETENTION CONTACT TAILS FOR RETAINING TO A PCB PRIOR TO SOLDERING AS WELL AS REDUCING FORCE OF INSERTING THE CONTACT TAILS TO THE PCB

(75) Inventors: Iosif Korsunsky, Harrisburg, PA (US); Kevin E. Walker, Hershey, PA (US); Joanne E. Shipe, Harrisburg, PA (US); Tod M. Harlan, Mecahnicsburg, PA (US); Wei-Chen Lee, Harrisburg, PA (US); Robert W. Brown, Harrisburg, PA (US); James H. Hyland, Hummelstown, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/120,003

(22) Filed: Apr. 9, 2002

(51) Int. Cl.[7] ............................................. H01R 12/00
(52) U.S. Cl. ..................... 439/82; 439/874; 439/882
(58) Field of Search ................. 439/82, 78, 79, 439/80, 81, 83, 84, 571, 567; 29/840, 832, 827, 874, 882, 842, 884, 843, 845

(56) References Cited

U.S. PATENT DOCUMENTS 4,735,587 A * 4/1988 Kirayogiu .................... 439/751
5,120,257 A * 6/1992 Hahn .......................... 439/567

* cited by examiner

Primary Examiner—Ross Gushi
(74) Attorney, Agent, or Firm—Wei Te Chung

(57) ABSTRACT

An electrical connector (1) includes an insulative housing (10) and a number of contacts (28) attached to the housing. The contacts each have a contact tail (36) downwardly extending beyond a mounting surface (32) of the insulative housing for inserting into throughholes (42) of a PCB (40). The contact tails are overlapped in pairs and each pair of contact tails is inserted into the same throughhole of the PCB. Some pairs of contact tails, called retention contact tails (68), have protrusions (52) deviating from each other for bearing against peripheral walls of the throughholes of the PCB thereby producing retention force. The other pairs of contact tails, called non-retention contact tails (70), do not have protrusions and do not interfere with peripheral walls of the other throughholes thereby reducing the insertion force. The retention contact tails can be modified to the non-retention contact tails by severing the protrusions therefrom.

19 Claims, 14 Drawing Sheets

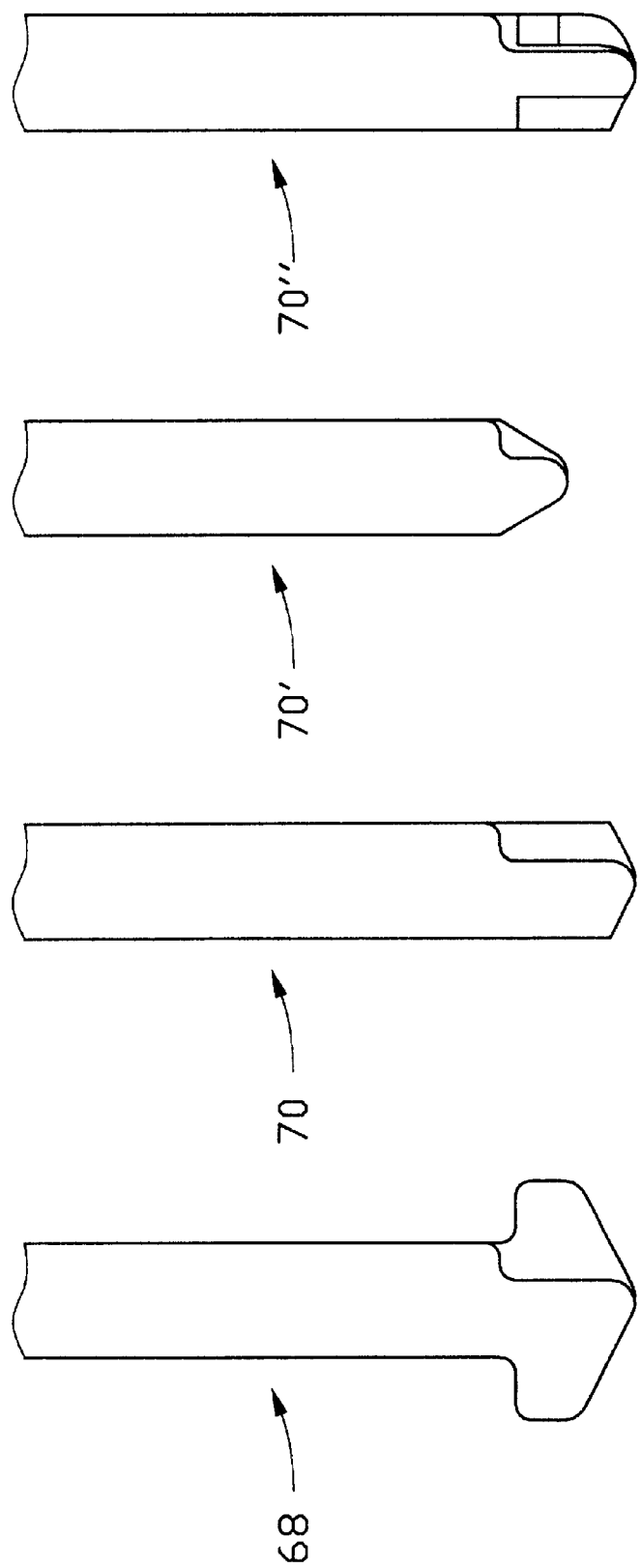

ELECTRICAL CONNECTOR HAVING RETENTION CONTACT TAILS AND NON-RETENTION CONTACT TAILS FOR RETAINING TO A PCB PRIOR TO SOLDERING AS WELL AS REDUCING FORCE OF INSERTING THE CONTACT TAILS TO THE PCB

BACKGROUND OF THE INVENTION

1. Field of the Invention

The present invention relates to the technology of manufacturing an electrical connector, and particularly to the technology of manufacturing the electrical connector having retention contact tails for retaining the connector onto a printed circuit board (PCB) before the connector is soldered onto the PCB and non-retention contacts tails for reducing the force of inserting the contact tails to the PCB.

2. Description of the Related Art

Typical board retention designs require an interference feature into a hole on a printed circuit board (PCB). This can be accomplished with separate retention pins, for example, and board locks. Separate retention pins add to the overall product cost and take up extra space thereby adding to the size of the connectors. So, there is a trend of using contact tails to accomplish the retention feature. In order to keep manufacturing and assembly costs minimal, typically all retention pins exhibit the same geometry. This leads to having all the contact tails provide retention but not all. This approach has the negative impact of increasing the insertion force. Ideally, it would be beneficial to have some contact tails accomplish the retention feature and the other contact tails do not accomplish the retention feature, thereby permitting flexibility in the insertion and retention characteristics of the connectors.

U.S. Pat. No. 5,411,404, issued to THE WHITAKER CORPORATION, discloses an electrical connector having contact tails with retention feature and contact tails without retention feature. However, the retention feature contact tails and the non-retention feature contact tails have different geometries created by hard tooling, dies, and the geometries cannot be readily changed from one to the other. This adds to the manufacturing cost of the connector. Hence, an improved electrical connector whose retention feature contact tails and the non-retention feature contact tails can be created in the same tools will overcome the disadvantage of the prior art.

SUMMARY OF THE INVENTION

A first objective of the present invention is to provide an electrical connector having conductive contacts, some of which have a retention feature while others do not have a retention feature and both can be manufactured in the same tools, thereby reducing the manufacturing cost.

A second objective of the present invention is to provide an electronic device including a printed circuit board (PCB) and the aforementioned electrical connector retained onto the PCB.

A third objective of the present invention is to provide a method of manufacturing the conductive contacts of the aforementioned electrical connector.

To fulfill the above objectives, an electrical connector including an insulative housing and a plurality of contacts attached to the housing was invented. The contacts each have a contact tail downwardly extending beyond a mounting surface of the insulative housing for inserting into a throughhole of the PCB. The contact tails are overlapped in pairs and each pair of contact tails is inserted into the same throughhole of the PCB. Some pairs of contact tails, called retention contact tails, have protrusions deviating from each other for bearing against the peripheral walls of the throughholes of the PCB thereby producing retention force. The other pairs of contact tails, called non-retention contact tails, do not have protrusions and do not interfere with the peripheral walls of the other throughholes of the PCB thereby producing no retention force. The retention contact tails can be modified to be non-retention contact tails by deforming the protrusions. In the first embodiment, the protrusions are sheared off. In the second embodiment, a portion of the contact tip having the protrusions is removed to provide a lead in chamfer for aiding in alignment of the contact tails to the holes of the PCB. In the third embodiment, the protrusions are swaged into notches of the other corresponding contact tails. The tail portions may be embedded in the plated holes or extend through the PC board, which is determined by thickness of the PC board and the length of the tail portions.

Other objectives, advantages and novel features of the invention will become more apparent from the following detailed description of the present embodiment when taken in conjunction with the accompanying drawings.

BRIEF DESCRIPTION OF THE DRAWINGS

FIGS. 9A–9D are planar views of FIGS. 8A–8D, respectively;

DESCRIPTION OF THE PREFERRED EMBODIMENT

Figure 1:
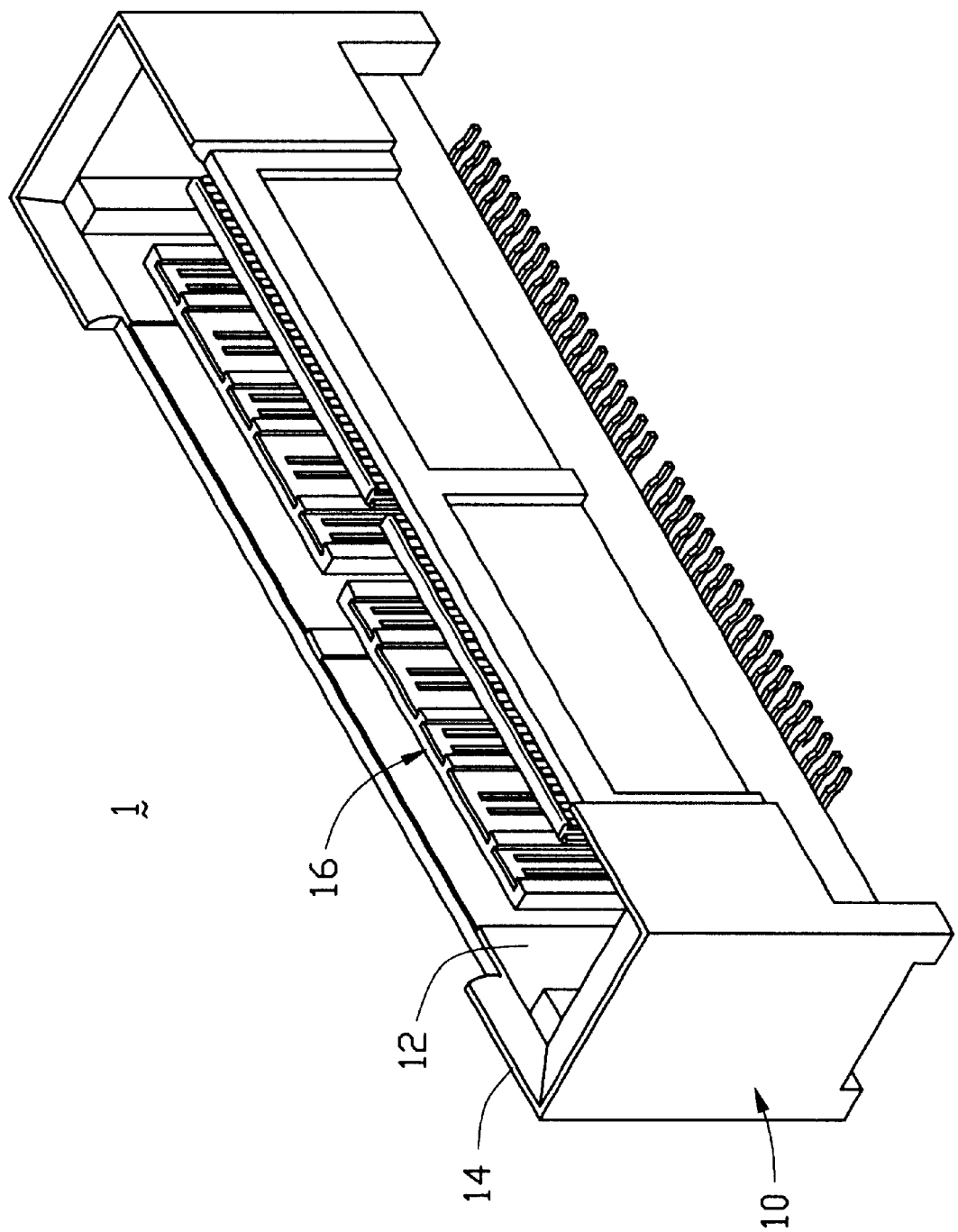
FIG. 1 is a perspective view of a board mountable electrical connector in accordance with the present invention.

Referring to FIGS. 1–4, an electrical connector 1 in accordance with the present invention comprises an insulative housing 10 defining a center slot 12 in an upper surface 14 thereof and several terminal modules 16 (four modules are preferably shown in FIG. 1) fixedly received in the center slot 12 of the housing 10 and arranged in two rows. Each terminal module 16 includes an insulative insert 18 and a plurality of signal contacts 20 and several grounding contacts 22 respectively attached to opposite surfaces 24, 26 of the insert 18. Each signal contact 20 has a mating portion 28 in the center slot 12 adapted for electrically engaging with a corresponding conductor of a mating connector (not shown) and a mounting tail portion 30 extending beyond a mounting surface 32 of the housing adapted for mounting to a corresponding conductive pad 38 on a PC board 40. Similarly, each grounding contact 22 has a mating portion 34 in the center slot 12 and a mounting tail portion 36 extending beyond the mounting surface 32 for engageably received in a plated hole 42 of the PC board 40.

Figure 2:
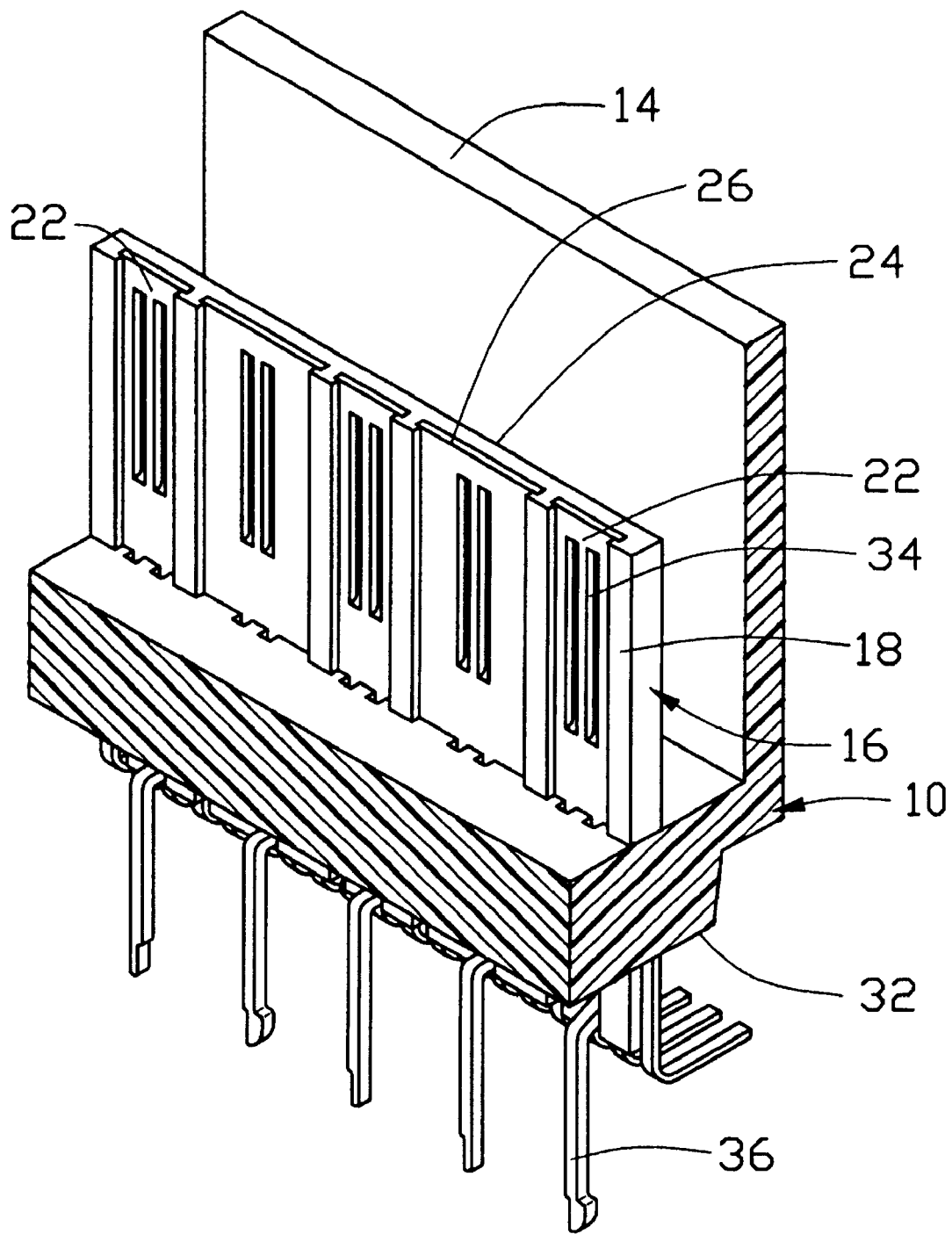
FIG. 2 is an enlarged perspective view of a part of the electrical in FIG. 1.
Figure 3:
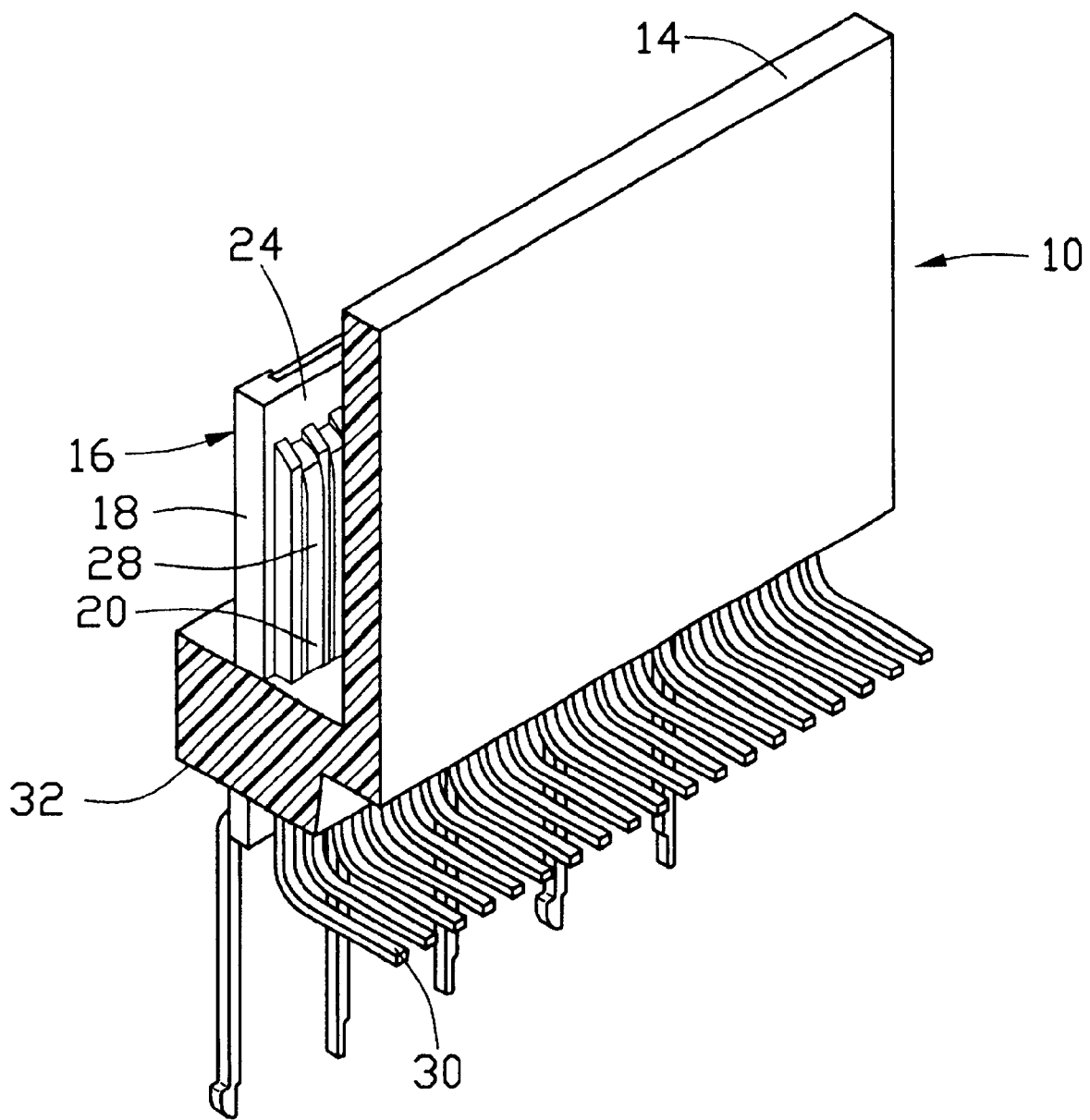
FIG. 3 is similar to FIG. 2 but viewed from a different angle.
Figure 4:
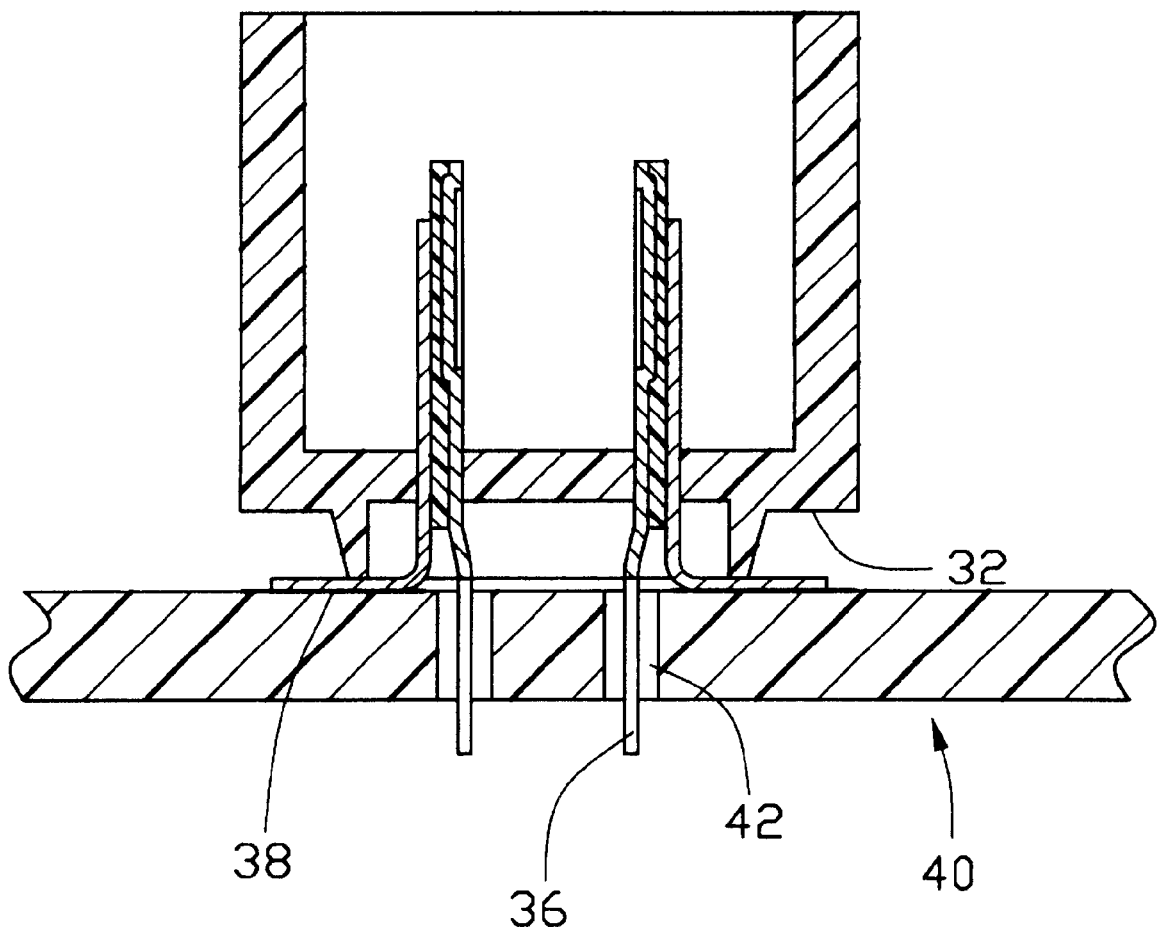
FIG. 4 is a cross-sectional view of the connector shown in FIG. 1 and a printed circuit board (PCB) on which the connector is mounted.
Figure 5:
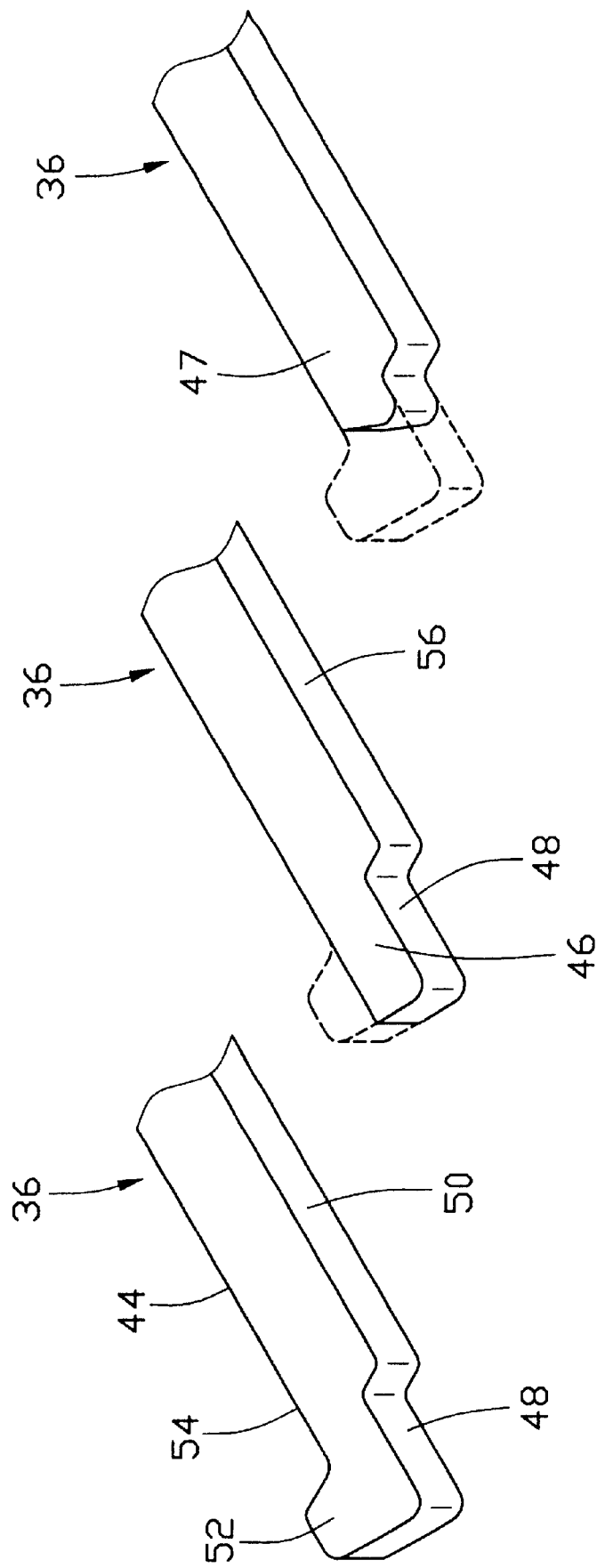
FIGS. 5A–5C are partially enlarged perspective view of the contact tails of the connector which respectively illustrate three different geometries of the contact tails.
Figure 6:
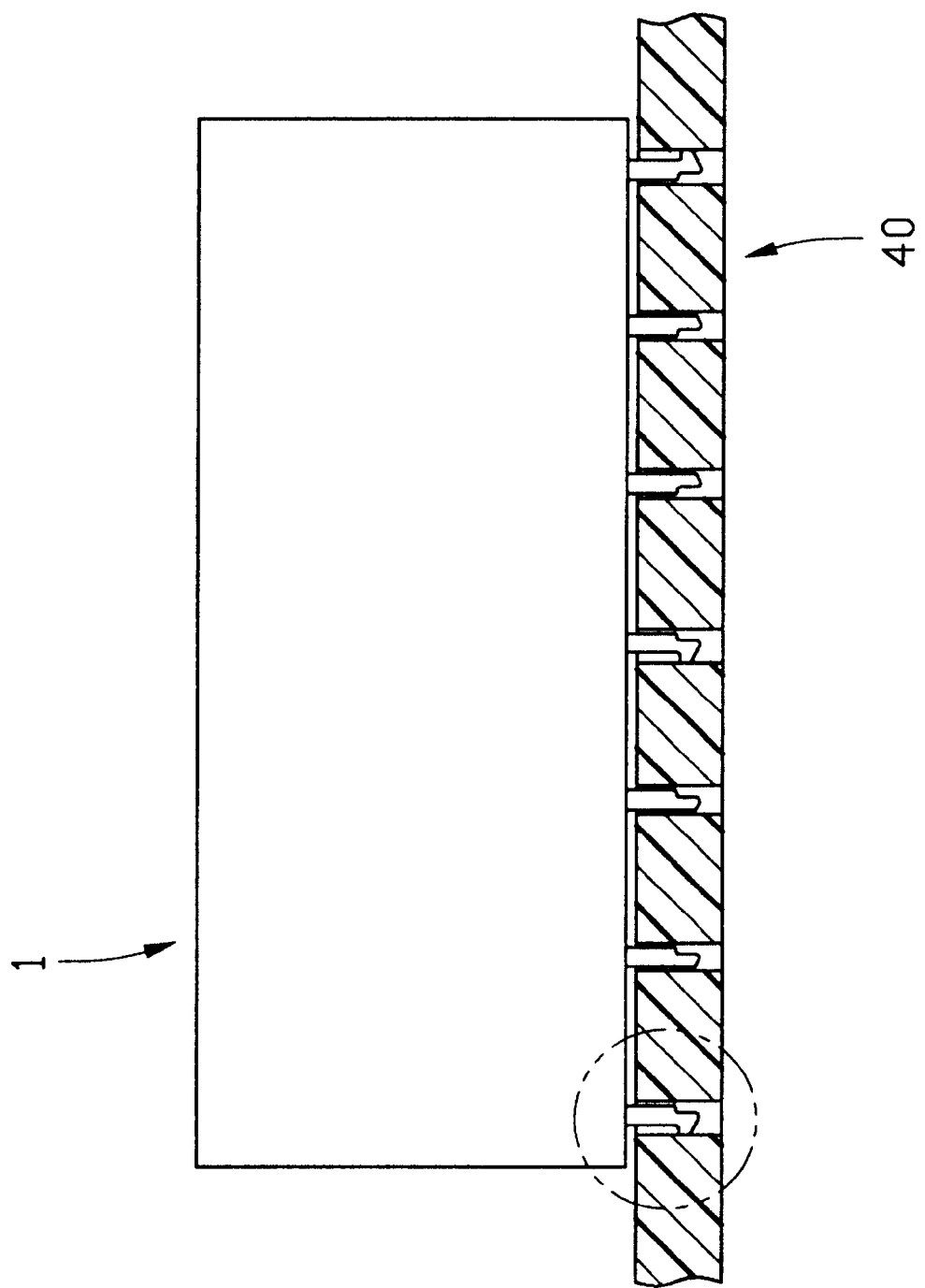
FIG. 6 is a planar view of the connector mounted onto the PCB, wherein the PCB is cross-sectioned to illustrate the engagement of the contact tails with holes of the PCB.

Referring to FIGS. 5A–5C in conjunction with FIGS. 2 and 3, the tail portions 36 of the grounding contacts 22 include retention pin type tails 44 and non-retention pin type tails 46 arranged along a longitudinal direction of the housing in a manner that one retention pin type tail 44 is followed by several non-retention pin type tails 46. The retention pin type tails 44 each have a larger size than the non-retention pin type tails 46 or a protrusion so that when the tail portions 36 are received in corresponding plated holes 42, the retention pin type tails 44 engage with peripheral walls of the plated holes 42 and produce retention force for maintaining the connector 1 to the PC board 40 while the non-retention pin type tails 46 do not (FIG. 6) engage with the peripheral walls of the plated holes 42. The retention force is adjustable by changing the number of the retention pin type tails 44. The retention pin type tail 44 defines a notch 48 at a side 50 thereof and has a barb 52 protruding outwardly from an opposite side 54 thereof. The non-retention pin type tail 46 may be modified from the retention pin type tail 44 by severing the barb 52 from the retention pin type tail 44 (shown by broken lines). FIG. 5C shows a second geometry of the non-retention pin type contact 47 which is modified from the retention pin type tail 44 by severing a tip portion containing the barb 52 to define a lead in chamfer for aiding in alignment of the non-retention pin type contact 47 to the hole 42 of the PCB 40.

Figure 6B:
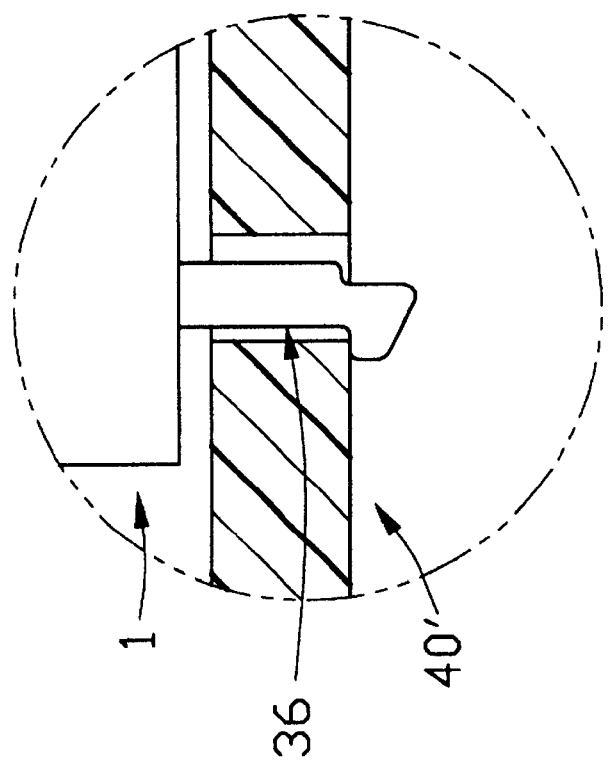
FIG. 6B is alternative condition of FIG. 6A.
Figure 6A:
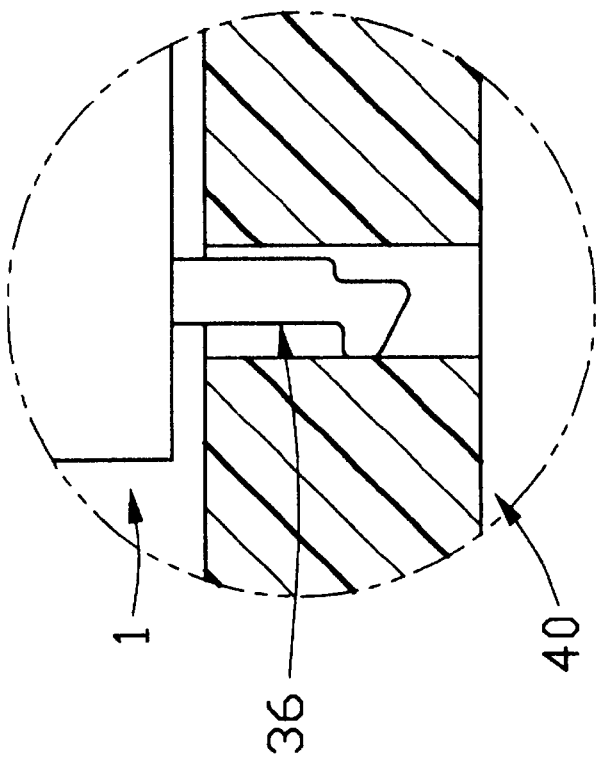
FIG. 6A is an enlarged view of a circled part in FIG. 6

Referring to FIGS. 6A and 6B, when the tail portions 36 are inserted into the plated holes 42 of the PC board 40, the retention pin type tails 44 interfere with the plated walls 42 and deflect which produces a retention force therebetween. The non-retention pin type tails 46 do not interfere with the plated holes 42 and no retention force is produced therebetween. The retention pin type tails 44 will increase the insertion force for attaching the connector 1 to the PC board 40. The insertion force can be controlled to an acceptable degree by reducing the number of retention pin type tails 44. The tail portions 44, 46 may be embedded in the plated holes 42 or extend through the PC board 40, which is determined by thickness of the PC board 40 and the length of the tail portions 44, 46.

Figure 7:
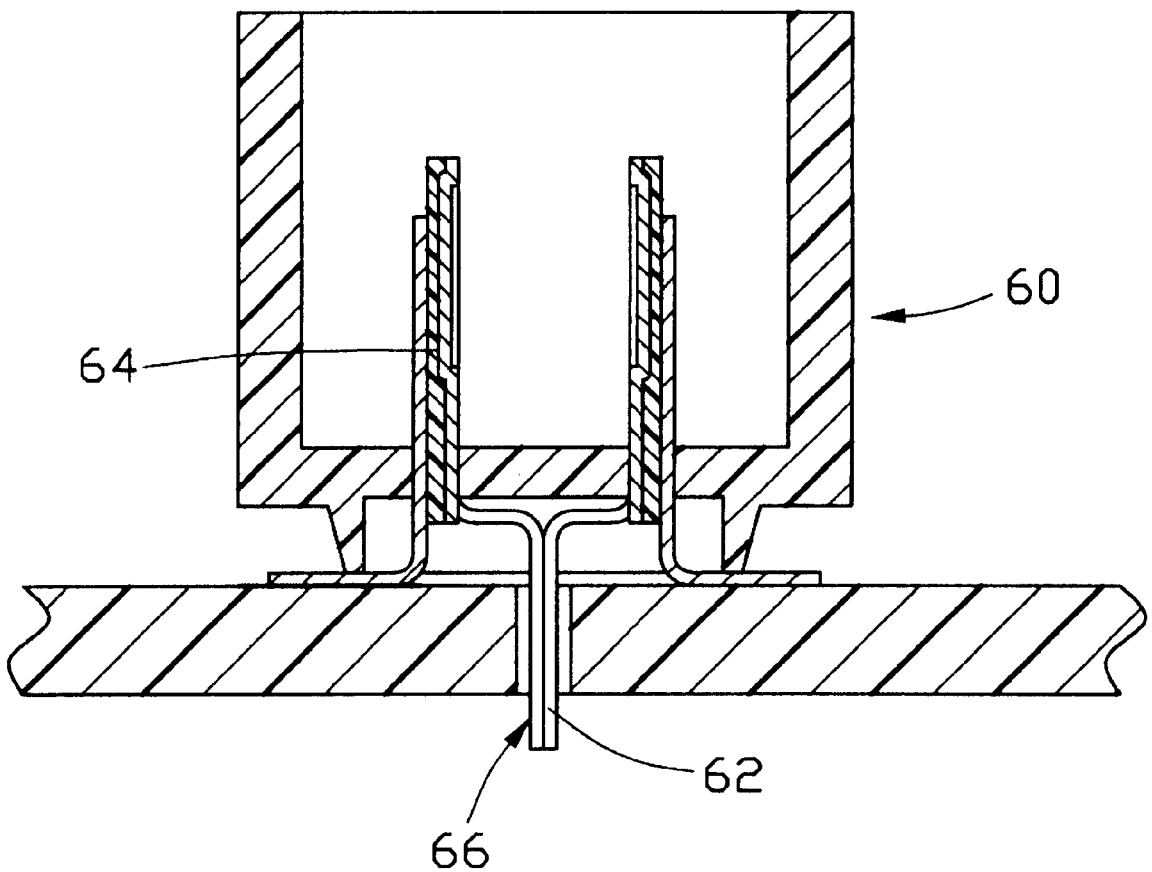
FIG. 7 is a view similar to FIG. 4 but illustrates a second embodiment of the present invention.
Figure 8B:
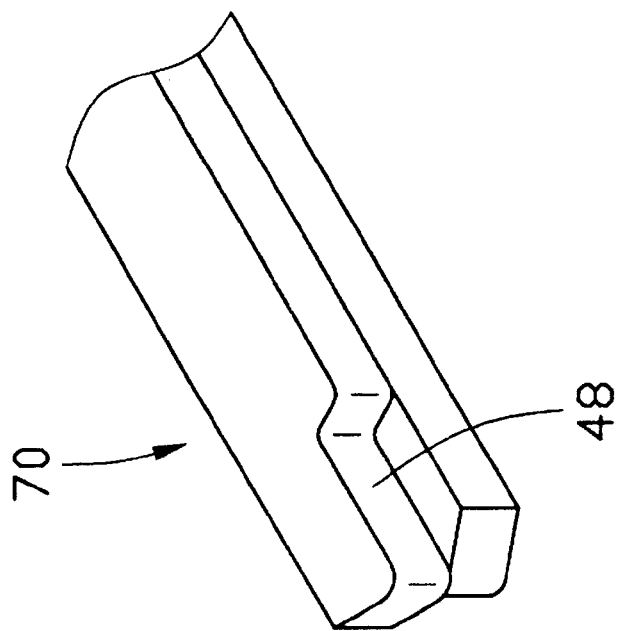
FIGS. 8A–8D are enlarged perspective views of the contact tails of the second embodiment of the present invention which illustrate four geometries of the contacts tails.
Figure 8A:
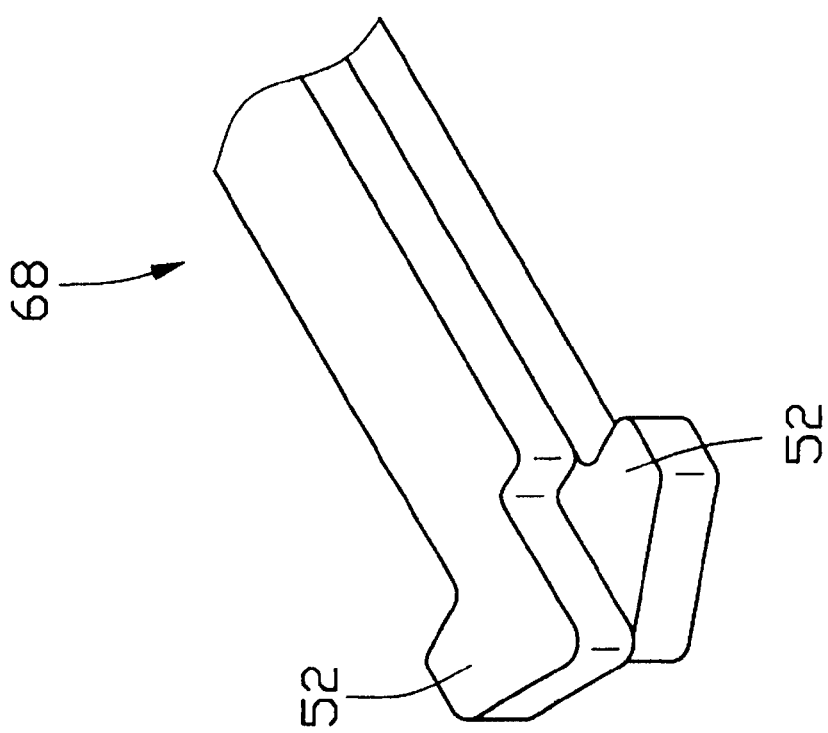
Figure 8D:
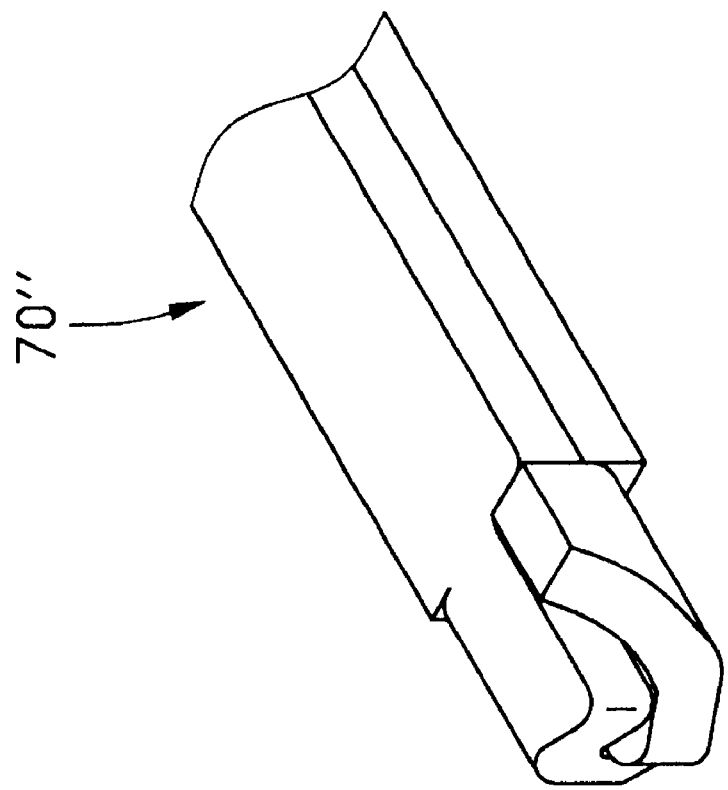
Figure 8C:
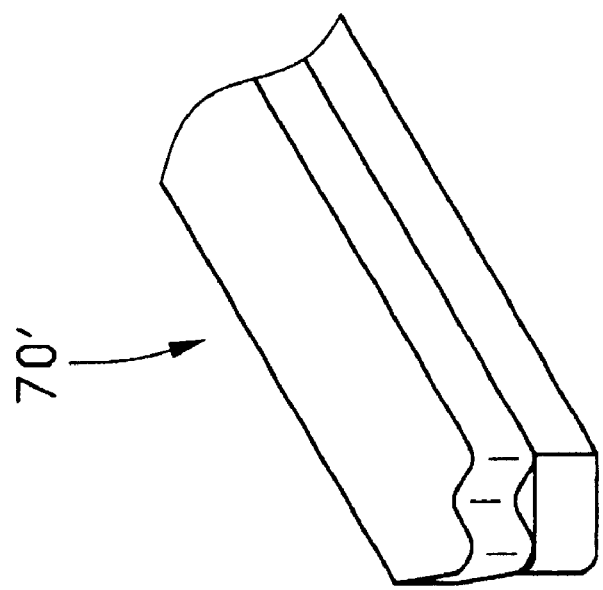

FIG. 7 illustrates an electrical connector 60 in accordance with a second embodiment of the present invention. This connector 60 is similar to the connector 1 of the first embodiment except that corresponding tail portions 62 of two rows of grounding contacts 64 deflect toward each other and overlap back to back to form overlapped tail portions 66. Each overlapped tail portion is received in the same plated hole 42 of the PC board 40.

Figure 10:
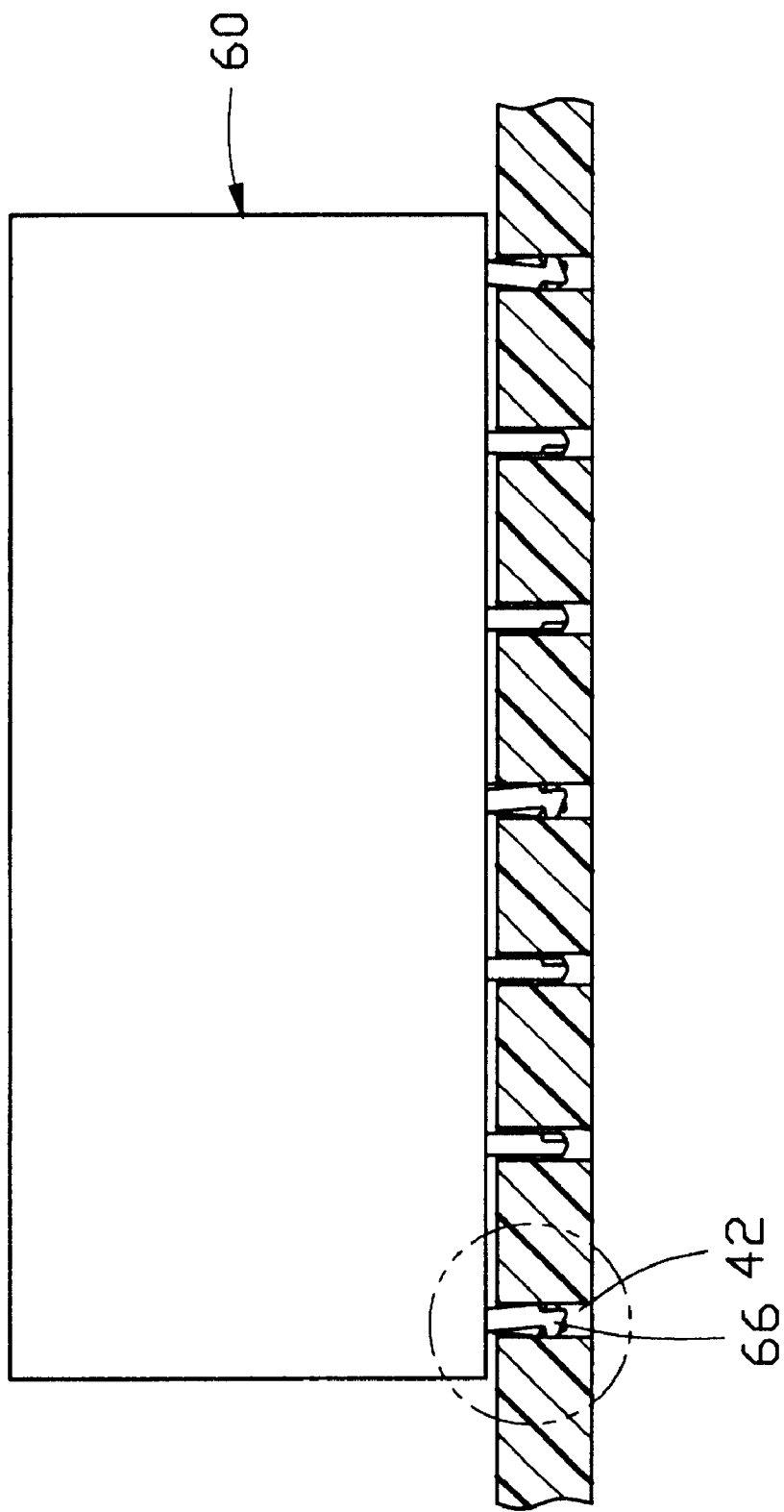
FIG. 10 is a view similar to FIG. 6 but illustrates the second embodiment of the present invention.
Figure 10A:
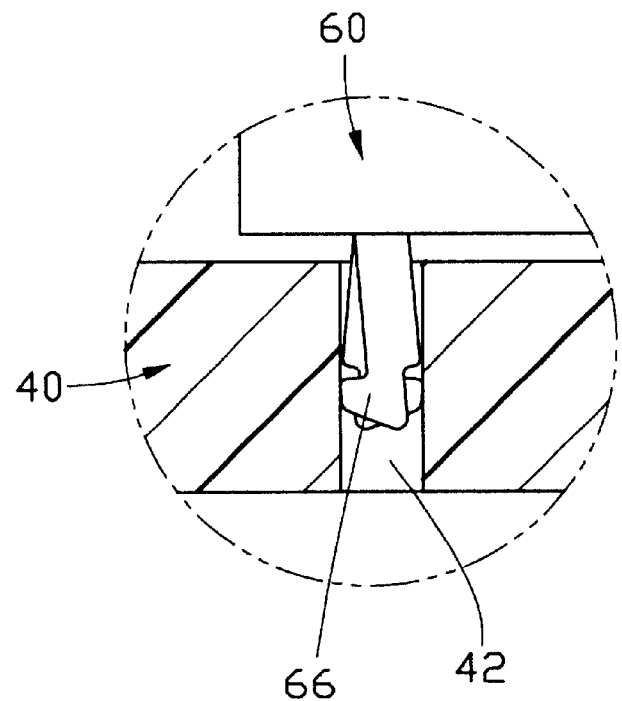
FIG. 10A is an enlarged view of a circled part of FIG. 10
Figure 10B:
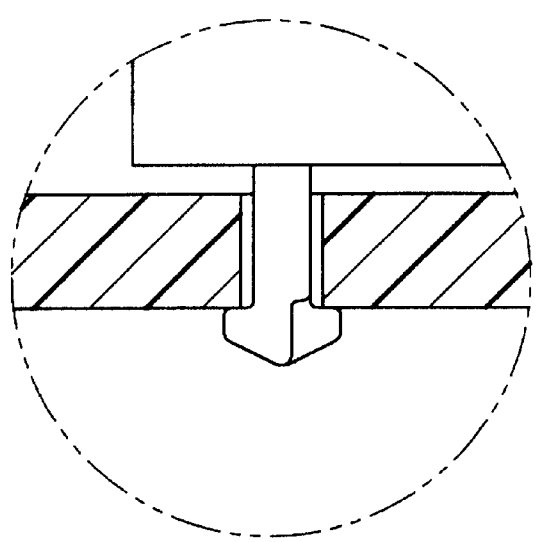
FIG. 10B is an alternative condition of FIG. 10A.

Referring to FIGS. 8A–8D and 9A–9D, the overlapped tail portions 66 include retention pin type 68 and non-retention pin type 70. Each retention pin type overlapped tail portion 68 includes two retention pin type tail portions 44 overlapped in a manner that the barbs 52 thereof are away from each other. Each non-retention pin type overlapped tail portion 70 includes two non-retention pin type tail portions 46 overlapped in a manner that the notches 48 thereof are away from each other. The retention pin type overlapped tail portions 68 may be further processed to become the non-retention pin type overlapped tail portions 70 simply by severing the barbs 52 therefrom (FIGS. 5B and 5C). The non-retention pin type overlapped tail portions have a second geometry designated by 70'in FIGS. 8C and 9C produced by trimming the rip of the lead. The barbs 52 may also be deformed into corresponding notches 48 to form a third geometry designated by 70" in FIGS. 8D and 9D. Referring to FIGS. 10, 10A and 10B, when mounting to a thicker PC board 40, the retention pin type overlapped tail portions 68 are embedded in the plated holes and biased by the peripheral walls of the plated holes to deflect in opposite directions. When mounting to a thinner PC board 40', the retention pin type overlapped tail portions 68 are inserted through the plated holes and bearing against a bottom surface of the thinner PC board 40'.

Figure 11:
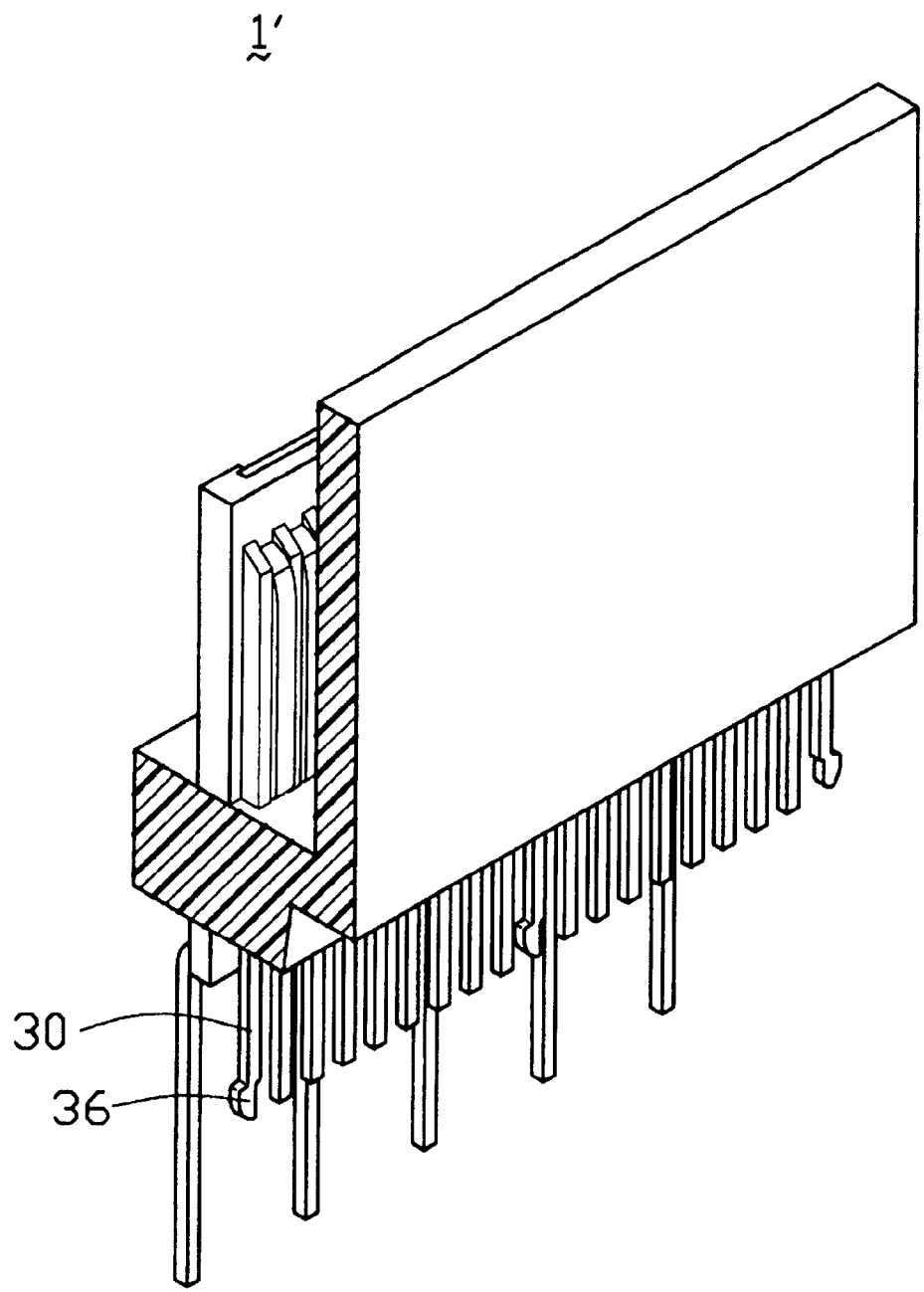
FIG. 11 is a view similar to FIG. 3 but illustrates a third embodiment of the connector of the present invention.

FIG. 11 illustrates a third embodiment of the present invention. In this embodiment, the signal contacts 20 are throughhole type and above-mentioned retention pin structures are applied to the tail portions 30 of the signal contacts 20 instead of the tail portions 36 of the grounding contacts 22.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   an insulative member having a mounting surface adapted for mounting onto a printed circuit board (PCB); and
   a plurality of conductive contacts attached to the insulative member, each conductive contact having a tail portion extending downwardly beyond the mounting surface of the insulative member for connecting corresponding conductive elements on the PCB, at least some tail portions being provided in sets and each set including two overlapped tail portions, prior to soldering the tail portions to the corresponding conductive elements on the PCB, some sets of tail portions having protrusions for engaging with corresponding surfaces of the PCB thereby producing retention force for retaining the connector onto the PCB while the other sets of tail portions do not have the protrusions and produce no retention force;
   wherein the some sets of tail portions being able to be modified to the other sets of tail portions by deforming the protrusions thereof.

2. The electrical connector as claimed in claim 1, wherein the some sets of tail portions belong to grounding contacts of the electrical connector.

3. The electrical connector as claimed in claim 1, wherein the some sets of tail portions belong to signal contacts of the electrical connector.

4. The electrical connector as claimed in claim 1, wherein the tail portions of the some sets each define a notch at a side thereof away from the protrusion.

5. The electrical connector as claimed in claim 4, wherein the some sets of tail portions are able to be modified to the other sets of tail portions by severing the protrusions therefrom.

6. The electrical connector as claimed in claim 4, wherein the some sets of tail portions are able to be modified to the other sets of tail portions by deforming the protrusions thereof into corresponding notches thereof.

7. An electronic device comprising:
a printed circuit board defining a plurality of holes; and
an electrical connector mounted to the printed circuit board, the electrical connector including:
an insulative member having a mounting surface confronting the printed circuit board; and
a plurality of conductive contacts attached to the insulative member, each conductive contact having a tail portion extending downwardly beyond the mounting surface of the insulative member to the printed circuit board, at least some tail portions being arranged in sets and each set including two overlapped tail portions, some sets of tail portions being inserted into corresponding holes of the printed circuit board and borne against by peripheral walls of the corresponding holes to deflect in opposite directions thereby providing retention force for retaining the connector onto the printed circuit board while the other sets of tail portions being inserted into the other corresponding holes of the printed circuit board without engagement with peripheral walls of the other corresponding holes.

8. The electronic device as claimed in claim 7, wherein the some sets of tail portions are embedded in the corresponding holes of the printed circuit board.

9. The electronic device as claimed in claim 7, wherein the some sets of tail portions are inserted through the corresponding holes of the printed circuit board to engage with a bottom surface of the printed circuit board away from the electrical connector.

10. The electronic device as claimed in claim 7, wherein the some sets of tail portions each have a protrusion at one side thereof and define a notch at an opposite side thereof, the protrusions of each set deviating from each other.

11. The electronic device as claimed in claim 10, wherein the some sets of tail portions are able to be modified to the other sets of tail portions by severing the protrusions therefrom.

12. The electronic device as claimed in claim 10, wherein the some sets of tail portions are able to be modified to the other sets of tail portions by deforming the protrusions thereof into corresponding notches thereof.

13. A method of manufacturing conductive contacts of an electrical connector mountable onto a printed substrate, the contacts including a predetermined number of contacts with retention feature that are engageable with the printed substrate for producing retention force for attaching the electrical connector onto the printed substrate prior to soldering and a predetermined number of contacts without the retention feature that are not engageable with the printed substrate and produce no retention force prior to soldering, the method comprising the steps of:
first, stamping metal sheets to form a plurality of conductive contacts, each contact including a tail portion for connecting a corresponding conductive element of the printed substrate, each tail portion having a protrusion at one side thereof;
second, shearing the protrusions of some selected tail portions so that there are tail portions with the protrusions and tail portions without the protrusions.

14. The method as claimed in claim 13, wherein the second step is replaced by the step of removing tip portions of the selected tail portions having the protrusions.

15. The method as claimed in claim 13, wherein in the first step a notch is defined at a side of the tail portion away from the protrusion.

16. The method as claimed in claim 15 further including a step after the first step and before the second step that overlapping two tail portions in a manner that the protrusions of the two overlapped tail portions deviate each other.

17. The method as claimed in claim 16, wherein the second step is replaced by the step of swaging the protrusions of some selected tail portions into corresponding notches of the selected tail portions.

18. An electrical connector assembly comprising:
an insulative housing;
a plurality of pairs of contacts extending within and further out of a mounting face of the housing; and
each of said pairs of contacts defining two overlapped tail portions extending downwardly with at distal ends thereof two protrusions laterally outwardly extending from two opposite side edges thereof, respectively, in an opposite manner, and two notches laterally inwardly offset from the other two side edges thereof under a condition of not only in opposite to each other but also in opposite to the corresponding protrusions, respectively; wherein
said two protrusions, in an extending manner, retainably engage a corresponding through hole of a printed circuit board on which the housing is seated, or in a folded manner within the corresponding notches, respectively, freely extend into the corresponding through hole of said printed circuit board.

19. The connector as claimed in claim 18, wherein the two protrusions of each pair of contacts engage two opposite sides of the corresponding through hole.

* * * * *